United States Patent
Kaneko et al.

(10) Patent No.: US 10,510,513 B2
(45) Date of Patent: Dec. 17, 2019

(54) PLASMA PROCESSING DEVICE AND HIGH-FREQUENCY GENERATOR

(71) Applicant: TOKYO ELECTRON LIMITED, Tokyo (JP)

(72) Inventors: Kazushi Kaneko, Miyagi (JP); Kazunori Funazaki, Miyagi (JP); Hideo Kato, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 554 days.

(21) Appl. No.: 14/380,331

(22) PCT Filed: Jan. 15, 2013

(86) PCT No.: PCT/JP2013/050575
§ 371 (c)(1),
(2) Date: Aug. 21, 2014

(87) PCT Pub. No.: WO2013/125260
PCT Pub. Date: Aug. 29, 2013

(65) Prior Publication Data
US 2015/0007940 A1    Jan. 8, 2015

(30) Foreign Application Priority Data
Feb. 23, 2012   (JP) ................ 2012-037266

(51) Int. Cl.
*H01J 37/32* (2006.01)
*H05H 1/46* (2006.01)
(Continued)

(52) U.S. Cl.
CPC ....... *H01J 37/32311* (2013.01); *C23C 16/511* (2013.01); *C23C 16/52* (2013.01);
(Continued)

(58) Field of Classification Search
CPC ............. H01J 37/32311; H01J 37/3444; H01J 37/32229; H01J 37/32201; H01J 37/3405;
(Continued)

(56) References Cited

U.S. PATENT DOCUMENTS

2004/0007984 A1* 1/2004 Coumou ........... H01J 37/32082
315/111.41
2004/0222184 A1* 11/2004 Hayami ............ H01J 37/32082
216/16
(Continued)

FOREIGN PATENT DOCUMENTS

JP    2003-179030 A    6/2003
JP    2004-265611 A    9/2004
(Continued)

OTHER PUBLICATIONS

International Search Report dated Apr. 23, 2013 in PCT/JP2013/050575.

*Primary Examiner* — Rakesh K Dhingra
(74) *Attorney, Agent, or Firm* — Rothwell, Figg, Ernst & Manbeck, P.C.

(57) ABSTRACT

Provided is a plasma processing device which processes an object to be processed using plasma. The plasma processing device includes: a processing container configured to perform a processing by the plasma therein; and a plasma generation mechanism including a high-frequency generator disposed outside the processing container to generate high-frequency waves. The plasma generation mechanism is configured to generate the plasma in the processing container using the high-frequency waves generated by the high-frequency generator. The high-frequency generator includes a high-frequency oscillator configured to oscillate the high-frequency waves and an injection unit configured to inject a signal into the high-frequency oscillator. The signal has a frequency which is the same as a fundamental fre- (Continued)

quency oscillated by the high-frequency oscillator and has reduced different frequency components.

17 Claims, 10 Drawing Sheets

(51) Int. Cl.
    *H01Q 21/06*     (2006.01)
    *H01Q 21/20*     (2006.01)
    *C23C 16/511*     (2006.01)
    *C23C 16/52*     (2006.01)
    *H01J 37/34*     (2006.01)

(52) U.S. Cl.
    CPC .... *H01J 37/3222* (2013.01); *H01J 37/32201* (2013.01); *H01J 37/32229* (2013.01); *H01J 37/32302* (2013.01); *H01J 37/3405* (2013.01); *H01J 37/3444* (2013.01); *H01Q 21/064* (2013.01); *H01Q 21/20* (2013.01); *H05H 1/46* (2013.01); *H01J 2237/327* (2013.01); *H01J 2237/334* (2013.01); *H01J 2237/3321* (2013.01); *H05H 2001/4622* (2013.01); *H05H 2001/4682* (2013.01)

(58) Field of Classification Search
    CPC ............. H01J 37/3222; H01J 37/32302; H01J 37/32192–32311; C23C 16/511; C23C 16/52; H01Q 21/064; H01Q 21/20; H05H 1/46; H05H 2001/4622
    USPC ................ 156/345.24–345.28; 118/715–733; 331/5, 86–91
    See application file for complete search history.

(56) References Cited

U.S. PATENT DOCUMENTS

| | | | |
|---|---|---|---|
| 2005/0029954 A1* | 2/2005 | Yokoshima | H01J 37/32192 315/111.21 |
| 2006/0091878 A1* | 5/2006 | Wilson | H01J 37/32082 324/76.14 |
| 2006/0124244 A1* | 6/2006 | Ishii | H01J 37/32192 156/345.42 |
| 2008/0231380 A1* | 9/2008 | Shinohara | H01J 23/34 331/86 |
| 2009/0091395 A1* | 4/2009 | Baek | H01J 23/15 331/5 |
| 2009/0267669 A1* | 10/2009 | Kasai | H01J 37/32192 327/164 |

FOREIGN PATENT DOCUMENTS

| | | | |
|---|---|---|---|
| JP | 2005-184297 | * | 7/2005 |
| JP | 2007-228219 A | | 9/2007 |
| JP | 2008-130398 A | | 6/2008 |
| JP | 2009-80997 A | | 4/2009 |
| JP | 2010-283678 A | | 12/2010 |

* cited by examiner

PLASMA PROCESSING DEVICE AND HIGH-FREQUENCY GENERATOR

CROSS REFERENCE TO RELATED APPLICATION

This application is a 35 U.S.C. 371 National Phase Entry Application from PCT/JP2013/050575, filed Jan. 15, 2013, which claims priority to Japanese Patent Application No. 2012-037266, filed Feb. 23, 2012, the disclosures of which are incorporated herein in their entirety by reference.

TECHNICAL FIELD

The present invention relates to a plasma processing device and a high-frequency generator, and more particularly, to a high-frequency generator that generates microwaves and a plasma processing device that generates plasma using the microwaves.

BACKGROUND ART

For example, a semiconductor element such as a large scale integrated circuit (LSI) or a metal oxide semiconductor (MOS) transistor, a liquid crystal display (LCD), or an organic electro luminescence (EL) element is manufactured by performing a processing such as, for example, etching, chemical vapor deposition (CVD), or sputtering on a substrate to be processed which is a processing target. With respect to the processing such as the etching, the CVD, or the sputtering, a processing method using plasma as an energy supply source includes, for example, plasma etching, plasma CVD, or plasma sputtering.

Herein, a technology related to a plasma processing device that performs a processing using the plasma is disclosed in WO 2004/068917 (Patent Document 1). According to Patent Document 1, a magnetron is used as a generation source of high-frequency waves when the microwaves are generated. Since the magnetron may be configured relatively inexpensively and further, output a high power, the magnetron is effectively used as the generation source that generates the microwaves.

PRIOR ART DOCUMENT

Patent Document

Patent Document 1: Publication WO 2004/068917

SUMMARY OF INVENTION

Problem to be Solved

The plasma processing device according to Patent Document 1 includes a high-frequency oscillator generating a high-frequency electromagnetic field and a reference oscillator, of which the output voltage is lower than that of the high-frequency oscillator and the oscillation frequency is stable. In addition, when a reference signal generated by the reference oscillator is injected into the high-frequency oscillator, the oscillation frequency of the high-frequency oscillator is fixed to a frequency of the reference signal. With this configuration, impedances at a load side and a power supply side are accurately matched by reducing frequency components different from the frequency of the reference signal from the oscillation frequencies of the high-frequency oscillator such that the high-frequency electromagnetic field is efficiently supplied to a processing container.

However, the method that fixes the oscillation frequency of the high-frequency oscillator to the frequency of the reference signal disclosed in Patent Document 1 is difficult to cope with the following situations.

As for a generation source of high-frequency waves, a device constituted by a mechanically machined product is used. For example, referring to a case using the magnetron, each member of the magnetron such as, for example, a filament, an anode vane constituting an anode side, or a cavity oscillation unit is constituted by a mechanically machined product. In such a case, a fluctuation so-called an instrumental error occurs among a plurality of magnetrons manufactured by assembling the mechanically machined products. As a result, a characteristic of an oscillation frequency in each magnetron slightly varies.

Specifically, a waveform of a fundamental frequency will be considered as a frequency characteristic of microwaves oscillated by a magnetron. Even if respective mechanically machined products constituting magnetrons are designed and assembled to manufacture the magnetrons such that the magnetrons have the same peak frequency of a fundamental frequency and the same waveform of the fundamental frequency, in some cases, the waveform of the fundamental frequency may have a profile in which the peak portion has a steep slope profile or in other cases, although the waveform of the fundamental frequency has a profile in which the peak portion is the highest, the peak portion does not have the steep slope profile but a generally gentle profile or the waveform of the fundamental frequency is greatly disturbed. This tendency is generally remarkable particularly at a low-power side. The waveform of the fundamental frequency requires a steep slope profile at the peak portion in view of the fact that strong resonance is requested. Thus, it is not preferable that the waveform of the fundamental frequency is significantly disturbed. In addition, the fluctuation in waveform of the fundamental frequency among the plurality of magnetrons may also result in a fluctuation of plasma generated by resonating the oscillated microwaves. Herein, in the method described in Patent Document 1, an oscillation frequency of the high-frequency oscillator is fixed to a frequency of a reference signal. Thus, even if such a method is used for all the magnetrons, it may be difficult to cope with a certain situation, for example, a situation in which the waveform of the fundamental frequency is significantly disturbed.

Further, as another frequency characteristic of the microwaves oscillated by the magnetron, there is a different frequency component called spurious which is unintended in terms of a design. The different frequency components are included in the microwaves. Even in terms of the different frequency components, the plurality of magnetrons manufactured as described above are frequently different from each other due to the fluctuation among the plurality of magnetrons. The different frequency components cause unexpected reflection waves in a waveguide through which the microwaves oscillated by the magnetron are propagated, which causes a power resulted from the unexpected reflection waves to be detected at a high-voltage power supply side that supplies the power to the magnetron. When the power is generated due to the unexpected reflection waves, the effective power of the magnetron or impedance of a load at the time of generating the microwaves is changed. Such a situation is not preferable in a plasma processing that requires stability in the effective power or the impedance of the load. In addition, when the method disclosed in Patent Document 1 is used, it is difficult to cope with such a situation.

Means to Solve Problem

In one aspect of the present invention, there is provided a plasma processing device which processes an object to be processed using plasma. The plasma processing device includes: a processing container configured to perform a processing by the plasma therein; and a plasma generation mechanism including a high-frequency generator disposed outside the processing container to generate high-frequency waves. The plasma generation mechanism is configured to generate the plasma in the processing container using the high-frequency waves generated by the high-frequency generator. Here, the high-frequency generator includes a high-frequency oscillator configured to oscillate the high-frequency waves and an injection unit configured to inject a signal into the high-frequency oscillator, the signal having a frequency which is the same as a fundamental frequency oscillated by the high-frequency oscillator and having reduced different frequency components.

With such a configuration, since a signal having a frequency which is the same as the fundamental frequency oscillated by the high-frequency oscillator and having reduced different frequency components is injected into the high-frequency oscillator, different frequency components in the high-frequency waves oscillated by the high-frequency oscillator may be reduced. As such, an effect caused when different components are included in the high-frequency waves oscillated by the high-frequency oscillator, specifically a concern about change in effective power or change in load impedance or disturbance of a waveform of the fundamental frequency based on unexpected generation of reflection waves by including the different frequency components may be reduced. Accordingly, plasma may be stably generated for a long period and a long life-span may be realized.

That is, in the plasma processing device in one aspect of the present invention, the fundamental frequency of the high-frequency oscillator itself is determined and then, a signal having a frequency which is the same as the determined fundamental frequency of the high-frequency oscillator and having reduced different frequency components is injected into the high-frequency oscillator so as to reduce the different frequency components in the oscillated fundamental frequency of the high-frequency oscillator itself.

Here, as a frequency characteristic of the microwaves oscillated by a magnetron, a center frequency which is a peak frequency of the fundamental frequency will be considered. For example, even though each mechanically machined product is designed and assembled so that the center frequency is 2.45 GHz to fabricate the magnetron, the center frequency may be 2.44 GHz in some cases or the center frequency may be 2.46 GHz in other cases.

However, even if the center frequency does not become a target frequency, stable standing waves or electromagnetic fields based on forming of the stable standing waves may be formed in a subsequent frequency matching process when the waveform, specifically, the center frequency has a steep slope around the target frequency or having a clean waveform which does not include different frequency components and is not generally disturbed. As a result, uniform plasma can be stably generated in the processing container. Accordingly, deviation from the target center frequency will not be a substantial problem. That is, the plasma processing device in one aspect of the present invention is intended to form a clean waveform which has a steep slope profile at a portion of the center frequency of the high-frequency oscillator itself and is not disturbed in the waveform of the fundamental frequency by reducing different frequency components which are a factor impeding stable generation of uniform plasma.

Further, the high-frequency generator may include an isolator configured to transmit a frequency signal unidirectionally from the high-frequency oscillator to a matcher positioned at a load side, and a waveguide provided between the high-frequency oscillator and the isolator and configured to propagate the high-frequency waves to the isolator side. The injection unit may include a branch circuit having a branch portion provided in the waveguide. In addition, the branch circuit may include a signal forming unit configured to form the signal having the frequency which is the same as the fundamental frequency oscillated by the high-frequency oscillator and the reduced different frequency components, using high-frequency waves branched from the branch portion and input to the branch circuit.

In addition, the injection unit may include a first circulator provided between the branch portion and the isolator on the waveguide and including three terminals. In the first circulator, a first terminal may be connected to the high-frequency oscillator side, a second terminal may be connected to the isolator side, and a third terminal may be connected at a side where the signal forming unit is provided.

Moreover, the signal forming unit may include an attenuator configured to branch a part of a frequency signal of the high-frequency waves from the branch portion and attenuate the frequency signal of the high-frequency waves so that an attenuated frequency signal is input into the branch circuit, or a directional coupler configured to branch a part of the frequency signal of the high-frequency waves from the branch portion and input the branched frequency signal into the branch circuit.

Further, the signal forming unit may include a first band-pass filter configured to perform filtering of a frequency of a predetermined band from the fundamental frequency oscillated by the high-frequency oscillator.

In addition, the signal forming unit may include an amplifier configured to amplify a frequency signal branched and input into the branch circuit and subjected to the filtering of the frequency of the predetermined band by the first band-pass filter, and a second band-pass filter configured to perform filtering of the frequency of the predetermined band from the frequency signal amplified by the amplifier.

The signal forming unit may be configured to include a frequency voltage conversion unit configured to convert the frequency input into the branch circuit from the attenuator or the directional coupler into a voltage, and a high-frequency oscillation unit configured to oscillate a frequency which is the same as the fundamental frequency oscillated by the high-frequency oscillator by the voltage converted by the frequency voltage conversion unit. The injection unit may be configured to inject the frequency signal oscillated by the high-frequency oscillation unit into the high-frequency oscillator.

The signal forming unit may include an amplifier configured to amplify the frequency oscillated by the high-frequency oscillation unit, and a band-pass filter configured to filter the frequency of the predetermined band from the frequency signal amplified by the amplifier. With such a configuration, different frequency components may be reduced from the fundamental frequency oscillated by the high-frequency oscillator more reliably and highly precisely.

In addition, the injection unit may be configured to inject a signal of power which is 2% or less of maximum rated power of the high-frequency oscillator.

The high-frequency oscillation unit may include any one of a semiconductor oscillator, a VCO, and an MEMS oscillator.

Further, the branch circuit may include a second circulator, and in the second circulator, a first terminal may be connected to the band-pass filter, the second terminal may be connected to a third terminal of the first circulator, and a third terminal may be connected to a dummy load. With such a configuration, the signal may be transmitted by the first and second circulators with good matching.

In addition, the isolator may be integrated with the branch circuit. With such a configuration, the above-described acting effects may be achieved by a simpler configuration.

Moreover, the plasma generation mechanism may include a dielectric window penetrating the high-frequency wave generated by the high-frequency oscillator into the processing container and a slot antenna plate having a plurality of slot holes and radiating the high-frequency wave to the dielectric window.

In addition, the plasma generated by the plasma generation mechanism may be generated by a radial line slot antenna.

In another aspect of the present invention, a high-frequency generator includes a high-frequency oscillator configured to oscillate high-frequency waves; and an injection unit configured to inject a signal into the high-frequency oscillator, the signal having a frequency which is the same as a fundamental frequency oscillated by the high-frequency oscillator and having reduced different frequency components.

According to the high-frequency generator, different frequency components can be reduced in the high-frequency waves oscillated by the high-frequency oscillator. As such, an effect caused when different components are included in the high-frequency waves oscillated by the high-frequency oscillator, specifically a concern about change in effective power or change in load impedance or disturbance of a waveform of the fundamental frequency based on unexpected generation of reflection waves by including the different frequency components may be reduced. Accordingly, high-frequency waves with a high quality can be stably generated over a long period.

Effect of Invention

According to the configuration of the plasma processing device, since a signal having a frequency which is the same as a fundamental frequency oscillated by a high-frequency oscillator and having reduced different frequency components is injected into the high-frequency oscillator, different frequency components can be reduced in high-frequency waves oscillated by the high-frequency oscillator. As such, an effect caused when different components are included in the high-frequency waves oscillated by the high-frequency oscillator, specifically a concern about change in effective power or change in load impedance or disturbance of a waveform of the fundamental frequency based on unexpected generation of reflection waves by including the different frequency components may be reduced. Accordingly, plasma can be stably generated for a long period and a long life-span can be realized.

Further, according to the high-frequency generator, different frequency components can be reduced in the high-frequency waves oscillated by the high-frequency oscillator. As such, an effect caused when different components are included in the high-frequency waves oscillated by the high-frequency oscillator, specifically a concern about change in effective power or change in load impedance or disturbance of a waveform of the fundamental frequency based on unexpected generation of reflection waves by including the different frequency components may be reduced. Accordingly, high-frequency waves with a high quality can be stably generated over a long period.

DETAILED DESCRIPTION TO EXECUTE THE INVENTION

Figure 1:
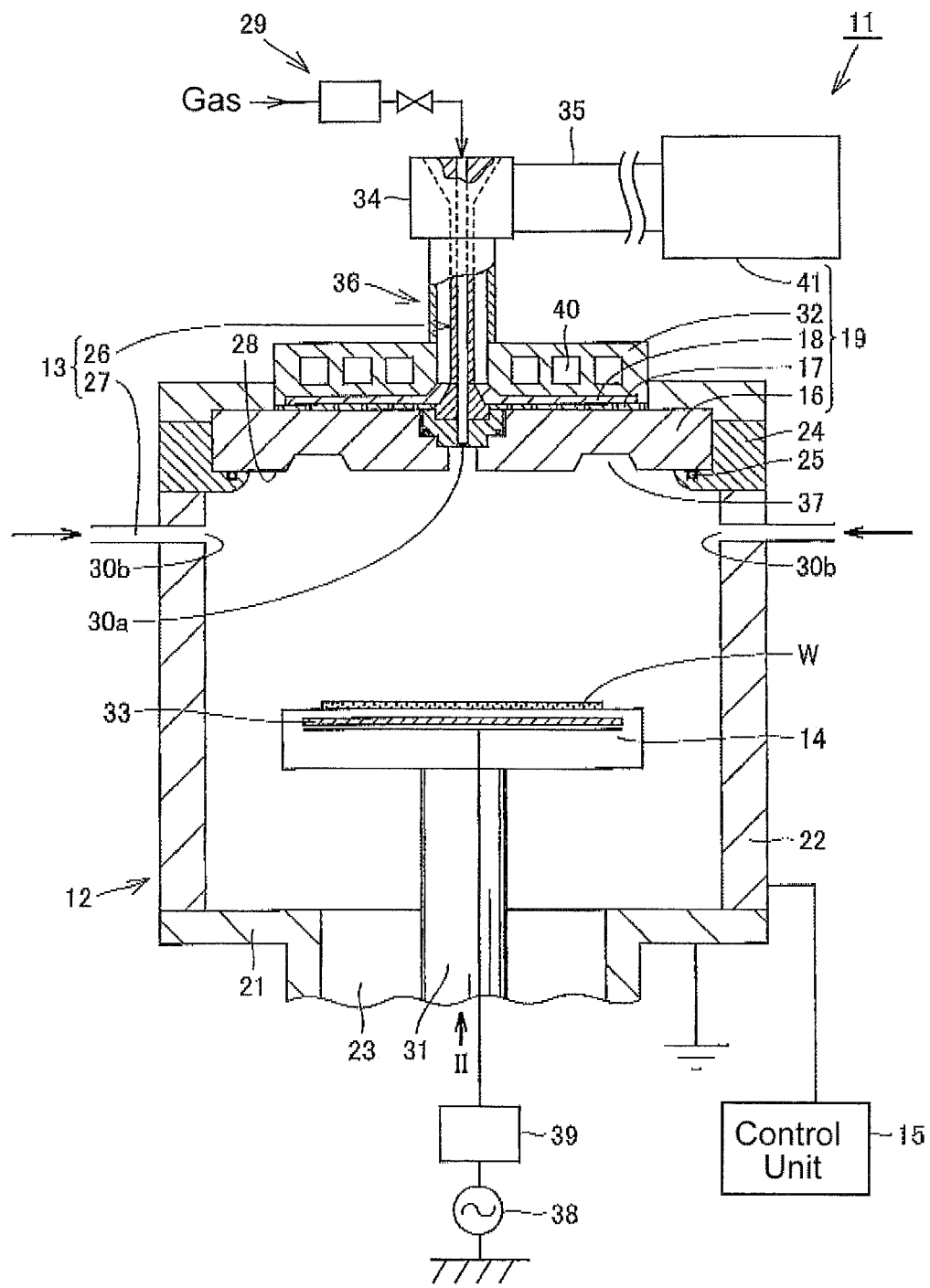
FIG. 1 is a schematic cross-sectional view illustrating a main portion of a plasma processing device according to an exemplary embodiment of the present invention.
Figure 2:
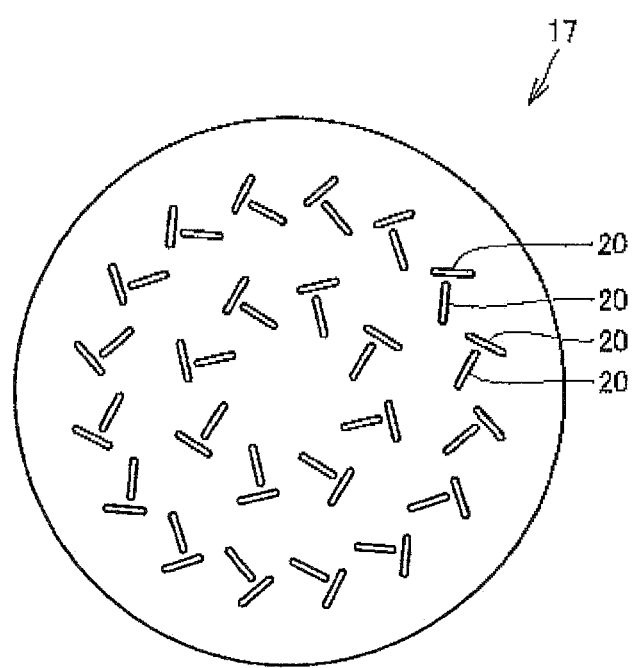
FIG. 2 is a schematic view illustrating a slot antenna plate included in the plasma processing device illustrated in FIG. 1, which is viewed in a direction indicated by the arrow II in FIG. 1.

Hereinafter, exemplary embodiments of the present invention will be described with reference to the accompanying drawings. FIG. 1 is a schematic cross-sectional view illustrating a main portion of a plasma processing device according to an exemplary embodiment of the present invention. FIG. 2 is a view illustrating a slot antenna plate included in the plasma processing device illustrated in FIG. 1, which is viewed from the bottom side, that is, in a direction indicated by the arrow II in FIG. 1. In addition, in FIG. 1, the hatching of some members is omitted for easy understanding. In addition, in the exemplary embodiment, the direction indicated by the arrow II in FIG. 1 or a vertical direction of a ground in FIG. 1 illustrated in an opposite direction to the direction indicated by the arrow II is referred to as a vertical direction in the plasma processing device.

Referring to FIGS. 1 and 2, the plasma processing device 11 processes a substrate W to be processed (hereinafter, referred to as a "processed substrate W") which is a processing target to be processed by using plasma. Specifically, a processing such as, for example, etching, CVD, or sputtering is performed. As the processed substrate W, a silicon substrate used for manufacturing a semiconductor device may be exemplified.

The plasma processing device 11 includes a processing container 12 configured to process the processed substrate W by plasma therein, a gas supply unit 13 configured to supply gas for plasma excitation or a gas for plasma processing into the processing container 12, a disc-shaped holding table 14 provided in the processing container 12 to hold the processed substrate W, a plasma generation mechanism 19 configured to generate the plasma in the processing container 12 by using microwaves, and a control unit 15 configured to control an operation of the entire plasma processing device 11. The control unit 15 performs a control of the entire plasma processing device 11 such as, for example, a control of a gas flow rate in the gas supply unit 13, or a pressure in the processing container 12.

The processing container 12 includes a bottom portion 21 positioned below the holding table 14 and a side wall 22 extending upward from the outer periphery of the bottom portion 21. The side wall 22 has a substantially cylindrical shape. An exhaust hole 23 for exhaustion is provided in the bottom portion 21 of the processing container 12 to penetrate a portion of the bottom portion 21. The top side of the processing container 12 is opened and the processing container 12 is configured to be sealed by a cover portion 24 disposed on the top side of the processing container 12, a dielectric window 16 to be described below, and an O ring 25 as a sealing member interposed between the dielectric window 16 and the cover portion 24.

The gas supply unit 13 includes a first gas supply unit 26 configured to spray a gas toward the center of the processed substrate W and a second gas supply unit 27 configured to spray a gas from the outside of the processed substrate W. A gas supply hole 30a configured to supply gas in the first gas supply unit 26 is provided at the center of the dielectric window 16 in a radial direction and at a position which retreats to an inner side of the dielectric window 16 from a bottom surface 28 of the dielectric window 16 which becomes an opposite surface facing the holding table 14. The first gas supply unit 26 supplies an inert gas for plasma excitation or a gas for plasma processing while adjusting a flow rate by a gas supply system 29 connected to the first gas supply unit 26. The second gas supply unit 27 is formed by providing a plurality of gas supply holes 30b configured to supply the inert gas for the plasma excitation or the gas of the plasma processing to the inside of the processing container 12 in a portion of an upper side of the side wall 22. The plurality of gas supply holes 30b is provided at regular intervals in a circumferential direction. The same kind of the inert gas for the plasma excitation or the gas for the plasma processing is supplied to the first gas supply unit 26 and the second gas supply unit 27 from the same gas supply source. Further, a separate gas may be supplied from the first gas supply unit 26 and the second gas supply unit 27 according to a request or a control content such that a flow rate ratio of the first and second gases may be adjusted.

In the holding table 14, a radio frequency (RF) bias high-frequency power supply 38 is electrically connected to an electrode in the holding table 14 through a matching unit 39. The high-frequency power supply 38 may output, for example, high-frequency waves of 13.56 MHz with a predetermined power (bias power). The matching unit 39 accommodates a matcher that takes a matching between an impedance of the high-frequency power supply 38 and an impedance of a load side which is mainly the electrode, the plasma, or the processing container 12, and a blocking condenser configured to generate a magnetic bias is included within the matcher. Further, in the plasma processing, the bias voltage may be or may not be supplied to the holding table 14.

The holding table 14 may hold the processed substrate W thereon by an electrostatic chuck (not illustrated). Further, the holding table 14 includes, for example, a heater (not illustrated) for heating, and may be set to a desired temperature by a temperature adjustment mechanism 33 provided in the holding table 14. The holding table 14 is supported on an insulative tubular support 31 that extends vertically upward from a lower side of the bottom portion 21. The exhaust hole 23 is provided to penetrate a portion of the bottom portion 21 of the processing container 12 along the outer periphery of the tubular support 31. An exhaust device (not illustrated) is connected to a lower side of the circular exhaust hole 23 through an exhaust pipe (not illustrated). The exhaust device has a vacuum pump such as, for example, a turbo molecular pump. The inside of the processing container 12 may be decompressed to a predetermined pressure by the exhaust device.

The plasma generation mechanism 19 is provided outside the processing container 12 and includes a microwave generator 41 configured to generate microwaves for the plasma excitation. Further, the plasma generation mechanism 19 includes the dielectric window 16 that is disposed at a position facing the holding table 14 and introduces the microwaves generated by the microwave generator 41 into the processing container 12. Further, the plasma generation mechanism 19 includes the slot antenna plate 17 disposed above the dielectric window 16 to radiate the microwaves to the dielectric window 16 in which the slot antenna plate 17 is provided with a plurality of slot holes 20. In addition, the plasma generation mechanism 19 includes a dielectric member 18 disposed above the slot antenna plate 17 so as to propagate microwaves introduced by a coaxial waveguide 36 in a radial direction. The coaxial waveguide 36 will be described below.

The microwave generator 41 is connected to an upper portion of the coaxial waveguide 36 configured to introduce the microwaves through a mode converter 34 and a waveguide 35. For example, TE-mode microwaves generated by the microwave generator 41 are converted to TEM-mode microwaves by the mode converter 34 and propagated to the coaxial waveguide 36, through a waveguide 35. A detailed configuration of the microwave generator 41 will be described below. The waveguide 35 side in the microwave generator 41 becomes a load side to be described below.

The dielectric window 16 is substantially disc-shaped and constituted by a dielectric. A circular concave portion 37 recessed in a tapered shape is provided on a portion of the bottom surface 28 of the dielectric window 16 so as to easily generate standing waves by the introduced microwaves. With the aid of the concave portion 37, plasma may be efficiently generated by the microwaves at the bottom side of the dielectric window 16. Further, a specific material of the dielectric window 16 may include quartz or alumina.

Figure 3:
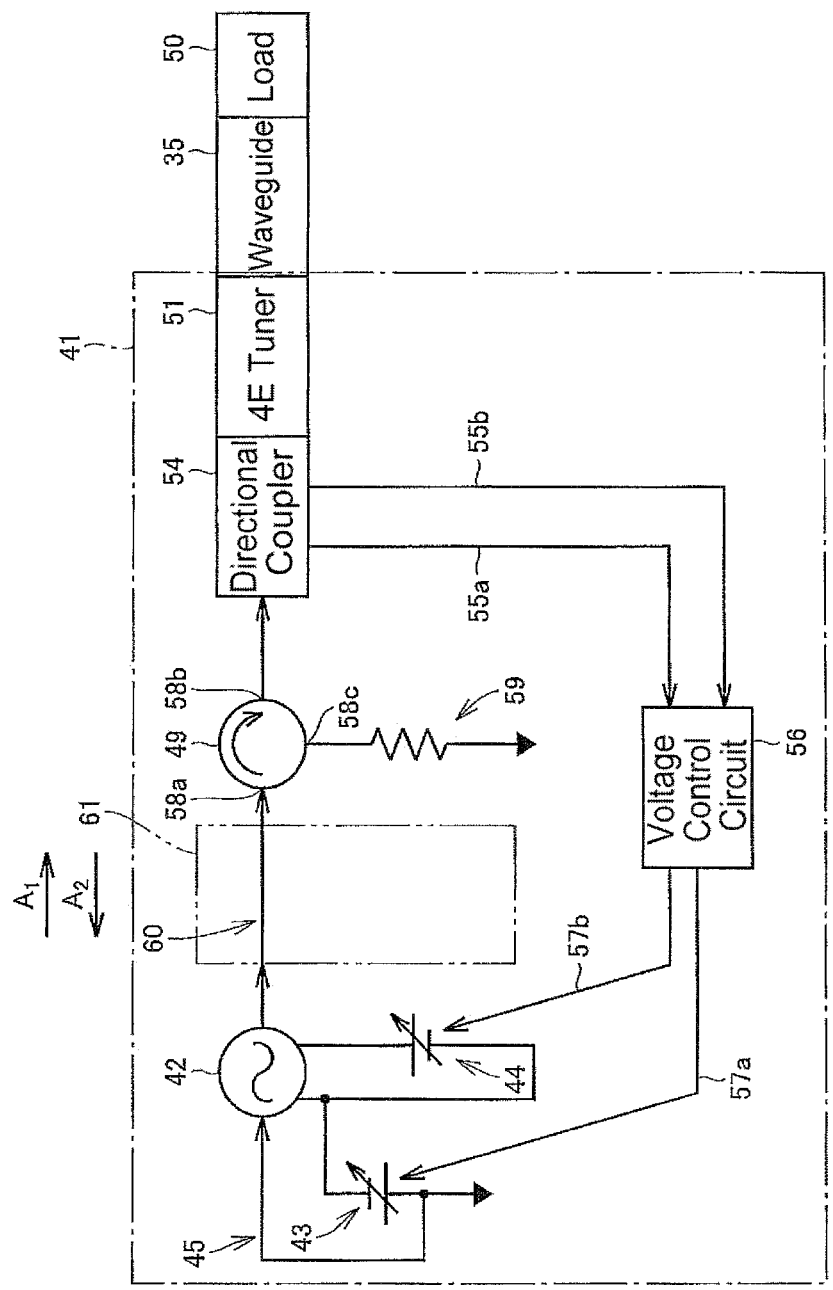
FIG. 3 is a block diagram illustrating a schematic configuration of a microwave generator.

The slot antenna plate 17 is a thin-film type and has a disc shape. As illustrated in FIG. 3, the plurality of slot holes 20 is provided in such a manner that each two slot holes 20 form a pair to be perpendicular at a predetermined interval, and slot pairs formed by the slot holes 20 are provided at a predetermined interval in the circumferential direction. Further, the plurality of slot pairs formed by the slot holes 20 is also provided at a predetermined interval in the radial direction.

The microwaves generated by the microwave generator 41 are propagated to the dielectric member 18 through the coaxial waveguide 36. The microwaves are expanded radially toward the outside in the radial direction in the dielectric member 18 sandwiched between a cooling jacket 32 and the slot antenna plate 17 to be radiated to the dielectric window 16 from the plurality of slot holes 20 provided on the slot antenna plate 17 in which the cooling jacket 32 includes a circulation path 40 therein so as to circulate coolant and adjusts a temperature of the dielectric member 18. After penetrating the dielectric window 16, the microwaves generate an electric field just below the dielectric window 16 so as to generate plasma in the processing container 12.

When microwave plasma is generated in the plasma processing device 11, a so-called plasma generation region having a relatively high electron temperature of plasma is formed in a region positioned just below the bottom surface 28 of the dielectric window 16, specifically, below the bottom surface 28 of the dielectric window 16 by several centimeters. In addition, a so-called plasma diffusion region is formed in a region positioned below the plasma generation region so as to diffuse the plasma generated in the plasma generation region. The plasma diffusion region is a region in which the electron temperature of the plasma is relatively low and the plasma processing is performed. In this case, since so-called plasma damage is not imparted to the processed substrate W in the plasma processing and further, an electron density of the plasma is high, the plasma processing may be performed efficiently.

Herein, descriptions will be made on a detailed configuration of the microwave generator 41 included in the plasma generation mechanism 19 provided in the plasma processing device 11 configured as described above.

Figure 4:
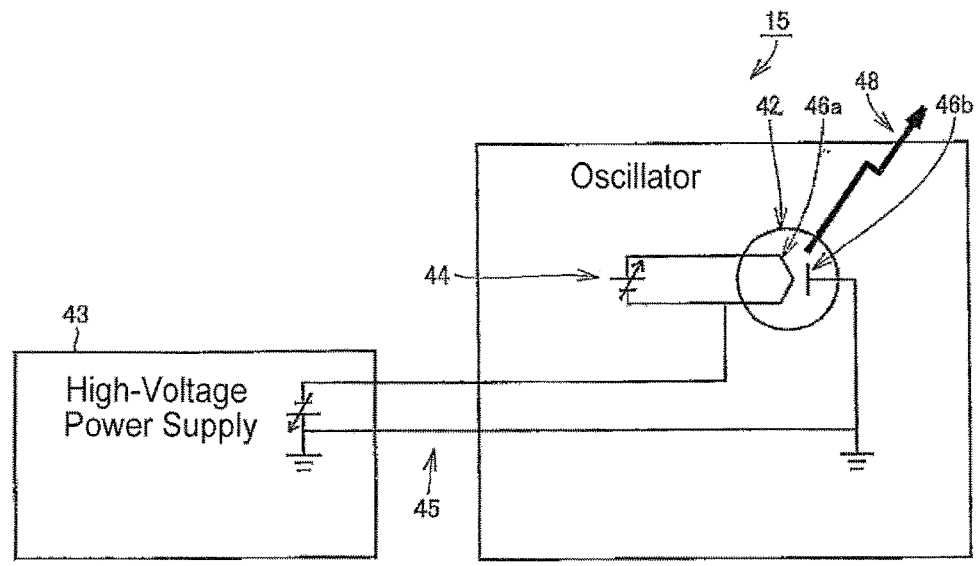
FIG. 4 is a schematic view illustrating a peripheral configuration of a magnetron included in the microwave generator.
Figure 5:
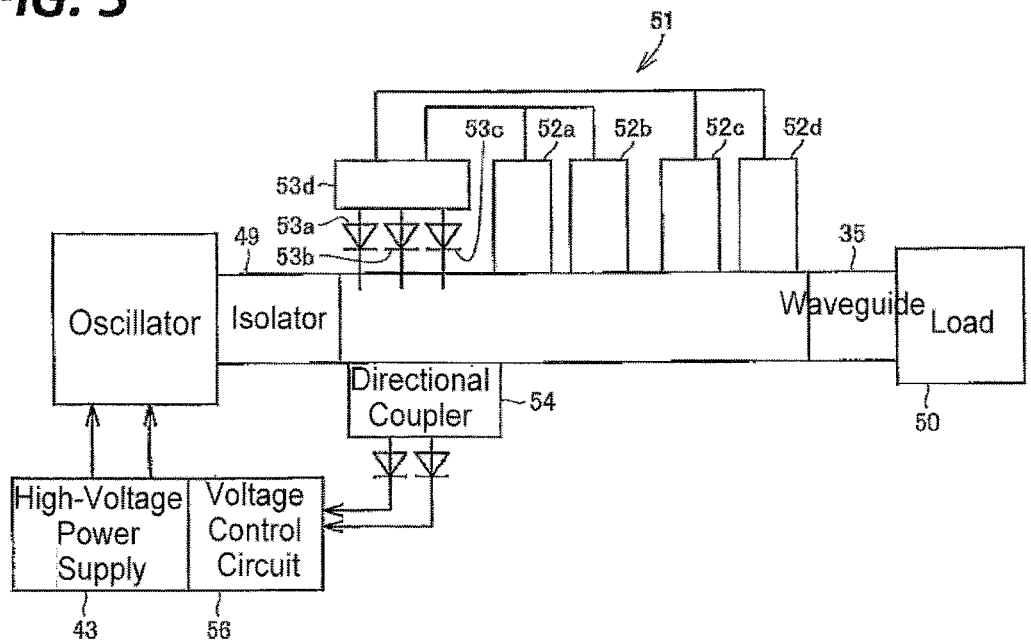
FIG. 5 is a schematic view illustrating a peripheral configuration of a 4E tuner included in the microwave generator.

FIG. 3 is a block diagram illustrating a schematic configuration of the microwave generator 41. FIG. 4 is a schematic view illustrating a peripheral configuration of a magnetron to be described below, which is included in the microwave generator 41. FIG. 5 is a schematic view illustrating a peripheral configuration of a 4E tuner to be described below, which is included in the microwave generator 41.

Referring to FIGS. 1 to 5, the microwave generator 41 includes a magnetron 42 as a high-frequency oscillator configured to oscillate microwaves as high-frequency waves, a high-voltage power supply 43 configured to supply a voltage to the magnetron 42, and a filament power supply 44 configured to supply a power to a filament constituting a cathode electrode 46a at the time of oscillating the high-frequency waves. An oscillation unit is constituted by the magnetron 42 and a launcher (not illustrated) configured to transfer the power of the microwaves of the magnetron 42 to a waveguide. The microwaves oscillated by the magnetron 42 travel in the direction indicated by the arrow $A_1$ in FIG. 3. Further, reflection waves of the microwaves travel in a direction indicated by the arrow $A_2$ which is an opposite direction to the arrow $A_1$ in FIG. 3.

A circuit 45 is configured between the magnetron 42 and the high-voltage power supply 43. An anode current is supplied to the magnetron 42 side from the high-voltage power supply 43 side through the circuit 45. The filament is incorporated in the circuit 45, inside the magnetron 42. Microwaves 48 output to the outside are generated by the cathode electrode 46a constituted by the filament and an anode electrode 46b formed by receiving the anode current from the high-voltage power supply 43. Further, the filament that becomes a cathode side constituting the cathode electrode 46a and an anode vane (not illustrated) that forms the anode electrode 46b that becomes the anode side are mechanically machined products manufactured through a mechanical machining.

Further, the microwave generator 41 includes a directional coupler 54 configured to connect the microwaves oscillated by the magnetron 42 through an isolator 49, and a 4E tuner 51 as the matcher. The isolator 49 unidirectionally transmits a frequency signal from the magnetron 42 to the 4E tuner 51 positioned at a load 50 side. The load 50 described herein is a member positioned at a downstream side of a so-called waveguide 35 such as, for example, the mode converter 34.

The 4E tuner 51 includes movable short-circuit units 52a, 52b, 52c, and 52d including four movable short-circuit plates (not illustrated) provided at a predetermined interval toward a traveling direction of the microwaves and three probes 53a, 53b, and 53c positioned at the magnetron 42 side with respect to the movable short-circuit unit 52a. The three probes 53a, 53b, and 53c are separated from each other by a distance of ⅛ of a fundamental frequency λ, that is, λ/8 toward the traveling direction of the microwaves. Further, projection amounts of tuning rods (not illustrated) which respectively correspond to the three probes 53a, 53b, and 53c are calculated by an arithmetic operation circuit 53d connected to the three probes 53a, 53b, and 53c.

In addition, the 4E tuner 51 is provided with the directional coupler 54 at the magnetron 42 side with respect to the movable short-circuit unit 52a. The directional coupler 54 is a bidirectional coupler. Further, the directional coupler 54 may not face the three probes 53a, 53b, and 53c. A power signal 55a of traveling waves that travel in the waveguide and a power signal 55b of the reflection waves that travel in the waveguide are sent to a voltage control circuit 56 provided in the microwave generator 41, using the bidirectional coupler 54. A control signal 57a of the voltage supplied by the high-voltage power supply 43 and a control signal 57b of voltage supplied by a filament power supply 44 are transmitted from the voltage control circuit 56 so as to control the voltage of the high-voltage power supply 43.

Further, the isolator 49 provided between the magnetron 42 and the 4E tuner 51 is configured by setting one terminal in a circulator which is a passive element, as a dummy load 59. That is, the isolator 49 is configured by connecting a first terminal 58a positioned at the magnetron 42 side with the oscillation unit, connecting a second terminal 58b positioned at the 4E tuner 51 side with the 4E tuner 51, and connecting the dummy load 59 to a remaining third terminal 58c. With this arrangement, the isolator 49 may unidirectionally transmit the frequency signal from the magnetron 42 to the 4E tuner 51 positioned at the load 50 side.

Herein, the microwave generator 41 includes a branch circuit 61 as an injection unit that injects a signal into the high-frequency oscillator, in which the signal has the same frequency as the fundamental frequency oscillated by the high-frequency oscillator and has reduced different-frequency components. The branch circuit 61 is provided by branching a waveguide 60 in the waveguide 60 extending from the oscillation unit to the isolator 49. The branch circuit 61 is indicated by a double-dot dashed line in FIG. 3.

Figure 6:
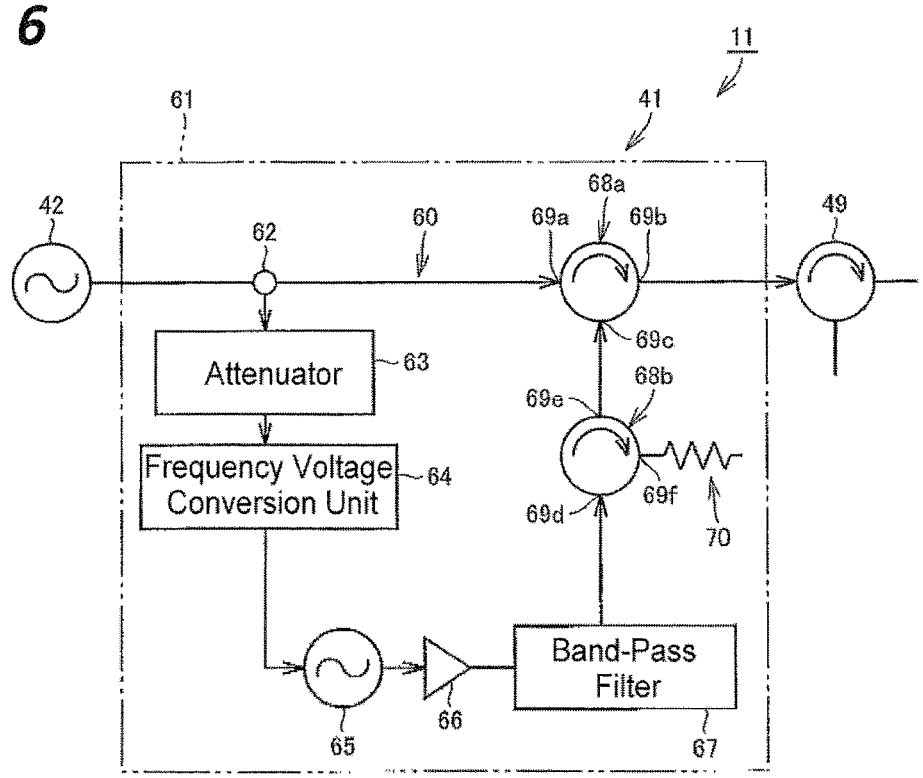
FIG. 6 is a block diagram illustrating a configuration of the branch circuit illustrated by a double-dot dashed line in FIG. 3.

Here, the configuration of the branch circuit 61 will be described. FIG. 6 is a block diagram illustrating a configuration of the branch circuit represented by a double-dot dashed line in FIG. 3. Referring to FIG. 6, the branch circuit 61 includes a branch portion 62 branched from the waveguide 60 extending from the magnetron 42 to the isolator 49, an attenuator 63 configured to attenuate a signal of a fundamental frequency branched from the branch portion 62, a frequency voltage conversion unit 64 configured to perform conversion from the frequency signal to a voltage signal with respect to a frequency signal attenuated by the attenuator 63, a semiconductor oscillator 65 configured to perform oscillation of the frequency based on the voltage signal converted by the frequency voltage conversion unit 64, a semiconductor amplifier 66 as an amplifier configured to amplify the frequency oscillated by the semiconductor oscillator 65, a band-pass filter 67 configured to perform filtering that, among the frequencies amplified by the semiconductor amplifier 66, allows only a predetermined frequency band to pass through the band-pass filter 67 and removes other frequency bands, a second circulator 68b configured to transmit the frequency signal to a first circulator 68a provided in the waveguide 60 with respect to the frequency filtered by the band-pass filter 67, and the first circulator 68a provided in the waveguide 60 and configured to inject the signal transmitted from the second circulator 68b into the magnetron 42 side.

In the first circulator 68a, a first terminal 69a is connected to the magnetron 42 side, a second terminal 69b is connected to the isolator 49 side, and a third terminal 69c is connected to a second terminal 69e of the second circulator 68b. In the second circulator 68b, a first terminal 69d is connected to the band-pass filter 67, the second terminal 69e is connected to the third terminal 69c of the first circulator 68a, and a third terminal 69f is connected to a dummy load 70. The second circulator 68b functions as an isolator configured to transmit the frequency signal unidirectionally from the band-pass filter 67 to the first circulator 68a. With this configuration, the signal may be transmitted with good consistency by the first circulator 68a.

Here, an operation of the branch circuit 61 included in the microwave generator 41 will be described. The microwaves oscillated from the magnetron 42 are partially branched by the branch portion 62. A frequency signal branched by the branch portion 62 and input to the attenuator 63 is attenuated by the attenuator 63. The attenuated frequency signal is converted into a voltage signal by the frequency voltage conversion unit 64. In addition, by the voltage signal based on the frequency signal, a frequency signal having a fundamental signal frequency which is the same as fundamental frequency of the microwaves oscillated from the magnetron 42 by the semiconductor oscillator 65 is formed. In addition, the frequency signal having the same fundamental frequency as the fundamental frequency of the microwaves formed by the semiconductor oscillator 65 is amplified by the semiconductor amplifier 66. The amplified frequency signal is filtered by the band-pass filter 67. The frequency signal from the semiconductor amplifier 66 or the band-pass filter 67 passes through a mode converter to be TE-converted and propagated to the waveguide. In addition, the frequency signal filtered by the band-pass filter 67 and having the same fundamental frequency as the fundamental frequency is injected again to the magnetron 42 side through the second and first circulators 68b and 68a. As a result, a signal having the same fundamental frequency as the fundamental frequency oscillated by the magnetron 42 and having reduced different frequency components is injected to the magnetron 42 by the branch circuit 67.

Here, the frequency voltage conversion unit 64 which converts the frequency input to the branch circuit 61 from the attenuator 63 into the voltage, and the semiconductor oscillator 65 which oscillates the same frequency as the fundamental frequency oscillated from the magnetron 42 by the voltage converted by the frequency voltage conversion unit 64 act as signal forming unit that form a signal having a frequency which is the same as the fundamental frequency oscillated by the magnetron 42.

Further, the semiconductor oscillator 65, the semiconductor amplifier 66, and the band-pass filter 67 act as the signal forming unit that forms a signal having a frequency which is the same as the fundamental frequency oscillated by the magnetron 42 and having reduced different frequency components, using high-frequency waves input to the branch circuit 61 branched from the branch portion 62.

With the configuration, since a signal having a frequency which is the same as the fundamental frequency oscillated by the magnetron 42 and having reduced different frequency components is injected into the magnetron 42, the different frequency components in the high-frequency waves oscillated by the magnetron 42 may be reduced. As such, an effect caused when different frequency components are included in high-frequency waves oscillated by the magnetron 42, specifically, a concern about change in effective power or in load impedance or disturbance of a waveform of a fundamental frequency, based on generation of unexpected reflective waves by the different frequency components may be reduced. Accordingly, plasma may be generated over a long period and a long lifespan may be realized.

Further, the microwave generator 41 as the high-frequency generator includes a magnetron 42 as the high-frequency oscillator that oscillates high-frequency waves and an injection unit that injects a signal having a frequency which is the same as the fundamental frequency oscillated by the magnetron 42 and having reduced different frequency components into the magnetron 42. As a result, the microwave generator 41 may reduce the different frequency components in the high-frequency waves oscillated by the magnetron 42. As such, an effect caused when different frequency components are included in high-frequency waves oscillated by the magnetron 42, specifically, a concern about change in effective power or in load impedance or disturbance of a waveform of a fundamental frequency, based on occurrence of unexpected reflective waves by including the different frequency components may be reduced. Accordingly, high-quality high-frequency waves may be generated over a long period.

In this case, a signal having a frequency which is the same as the fundamental frequency at which the magnetron 42 oscillates and having reduced different frequency components is injected into the magnetron 42 by the branch circuit 61 provided in the waveguide 60. As such, it is possible to cope with the following case. That is, the different frequency components are changed due to by a secular change of the magnetron 42, specifically, consumption of a filament as a mechanically machined member which is caused by a temperature increase due to heat generation, deformation of a vane (not illustrated), or the like. In this case, the injection unit that injects a signal having a frequency which is the same as the fundamental frequency oscillated by the magnetron 42 and having reduced different frequency components into the magnetron 42 is provided by the branch circuit 61, it is possible to reduce different frequency components generated based on the secular change of, for example, the filament in the magnetron 42.

In this case, since the microwaves having the same fundamental frequency as the fundamental frequency oscillated by the magnetron 42 are oscillated by the semiconductor oscillator 65, it is possible to oscillate the microwaves having little noise and a cleaned waveform. As a result, different frequency components may be significantly reduced with respect to the injected microwaves.

Further, in this case, since the attenuator 63 is used to branch a part of the frequency signal of the microwaves from the branch portion 62 and attenuate the frequency signal of the microwave so that the attenuated frequency signal is input to the branch circuit 61, handleability of the frequency signal branched from the waveguide 60 may be improved.

Further, since the band-pass filter 67 is used to allow a predetermined frequency band to pass therethrough and perform filtering of removing a frequency band other than the predetermined frequency band, it is possible to efficiently reduce different frequency components.

In this case, since the signal forming unit includes the frequency voltage conversion unit 64 configured to convert the frequency input to the branch circuit 61 from the attenuator 63 into a voltage, and the semiconductor oscillator 65 configured to oscillate a frequency which is the same as the fundamental frequency oscillated by the magnetron 42 using the voltage converted by the frequency voltage conversion unit 64, more different frequency components may be reduced from the frequency signal having the frequency which is the same as the fundamental frequency oscillated by the magnetron 42.

Further, in this case, a signal having a power of 2% or less of a maximum rated power of the magnetron 42 may be injected. That is, when the maximum rated power is 3000 W as a microwave power, a signal having a power of 60 W or less may be injected. As a result, different frequency components may be efficiently reduced.

Further, in this case, even when the output power is low, for example, when the output power is 20% of maximum rated power, the different frequency components may be efficiently reduced to clean the waveform of the fundamental frequency.

Further, in the exemplary embodiment illustrated in FIG. 6, instead of the semiconductor oscillator 65, a voltage controlled oscillator (VCO) may be used, or a micro electro mechanical system (MEMS) oscillator may also be used.

Further, the exemplary embodiment employs a configuration in which the semiconductor oscillator or the frequency voltage conversion unit associated with the semiconductor oscillator is provided. However, the present invention is not limited thereto, and these members may be omitted from the branch circuit so as to adopt the following configuration.

For example, in FIG. 6, when the different frequency components of an output of the semiconductor amplifier 66 are sufficiently small, the band-pass filter 67 may be removed and the output of the semiconductor amplifier 66 may be directly connected to the terminal 69d of the circulator 68b.

Figure 7:
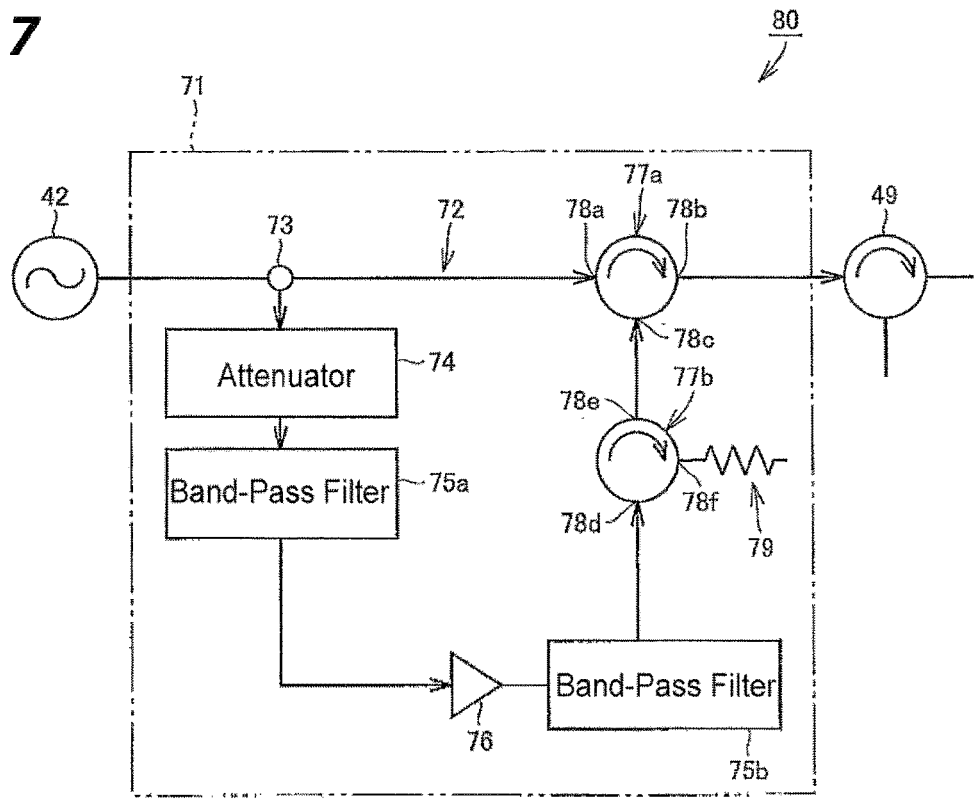
FIG. 7 is a block diagram illustrating a branch circuit included in a microwave generator provided in a plasma processing device according to another exemplary embodiment of the present invention.

FIG. 7 is a block diagram illustrating a branch circuit as an injection unit included in a microwave generator provided in a plasma processing device 80 according to another exemplary embodiment of the present invention. FIG. 7 corresponds to the diagram illustrated in FIG. 6. Further, since other configurations except for the branch circuit as the injection unit included in the microwave generator provided in the plasma processing device 80 according to another exemplary embodiment of the present invention are the same as the plasma processing device 11, the descriptions thereof will be omitted.

Referring to FIG. 7, a branch circuit 71 includes a branch portion 73 branched from a waveguide 72 extending from the magnetron 42 to the isolator 49, an attenuator 74 configured to attenuate a signal having a fundamental frequency branched from the branch portion 73, a first band-pass filter 75a configured to performing filtering of a frequency signal attenuated by the attenuator 74 to allow only a predetermined frequency band to pass therethrough, a semiconductor amplifier 76 configured to amplify the frequency with respect to the frequency filtered by the first band-pass filter 75a, a second band-pass filter 75b configured to performing re-filtering of the frequency amplified by the semiconductor amplifier 76 by allowing only a predetermined frequency band to pass therethrough, a second circulator 77b configured to transmit the frequency signal to a first circulator 77a provided in the waveguide 72 with respect to the frequency filtered by the second band-pass filter 75b, and a first circulator 77a provided in the waveguide 72 and configured to inject the signal transmitted from the second circulator 77b into the magnetron 42 side.

In the first circulator 77a, a first terminal 78a is connected to the magnetron 42 side, a second terminal 78b is connected to the isolator 49 side, and a third terminal 78c is connected to a second terminal 78e of the second circulator 77b. In the second circulator 77b, a first terminal 78d is connected to the second band-pass filter 75b, the second terminal 78e is connected to the third terminal 78c of the first circulator 77a, and a third terminal 78f is connected to a dummy load 79. The second circulator 77b functions as an isolator that transmits the frequency signal unidirectionally from the second band-pass filter 75b to the first circulator 77a.

That is, a substantial difference between the configuration of the branch circuit 61 illustrated in FIG. 6 and the configuration of the branch circuit 71 illustrated in FIG. 7 is to use the band-pass filter instead of a frequency voltage conversion unit and a semiconductor oscillator. With this configuration, the branch circuit 71 as the injection unit included in the microwave generator included in a plasma generation mechanism provided in the plasma processing device 80 according to another exemplary embodiment of the present invention may be cheaply configured. Of course, even in this case, different frequency components in the high-frequency waves oscillated by the magnetron 42 may be reduced. As such, it is possible to reduce an effect caused when different frequency components are included in the high-frequency waves oscillated by the magnetron 42. Accordingly, the plasma processing device 80 may stably generate plasma over a long period and realize a long lifespan.

In this case, since the signal forming unit is configured to include the semiconductor amplifier 76 as an amplifier that amplifies a frequency signal branched and input to the branch circuit 71 and subjected to the filtering of a predetermined band frequency by the first band-pass filter 75a, and the second band-pass filter 75b that performs the filtering of the predetermined band frequency of the frequency signal amplified by the semiconductor amplifier 76, it is possible to reduce different frequency components more reliably and highly precisely from the fundamental frequency oscillated by the magnetron 42.

Further, for example, in FIG. 7, when the different frequency components are sufficiently small in an output of the semiconductor amplifier 76, the band-pass filter 75b may be removed and the output of the semiconductor amplifier 76 may be directly connected to the terminal 78d of the circulator 77b.

Figure 8:
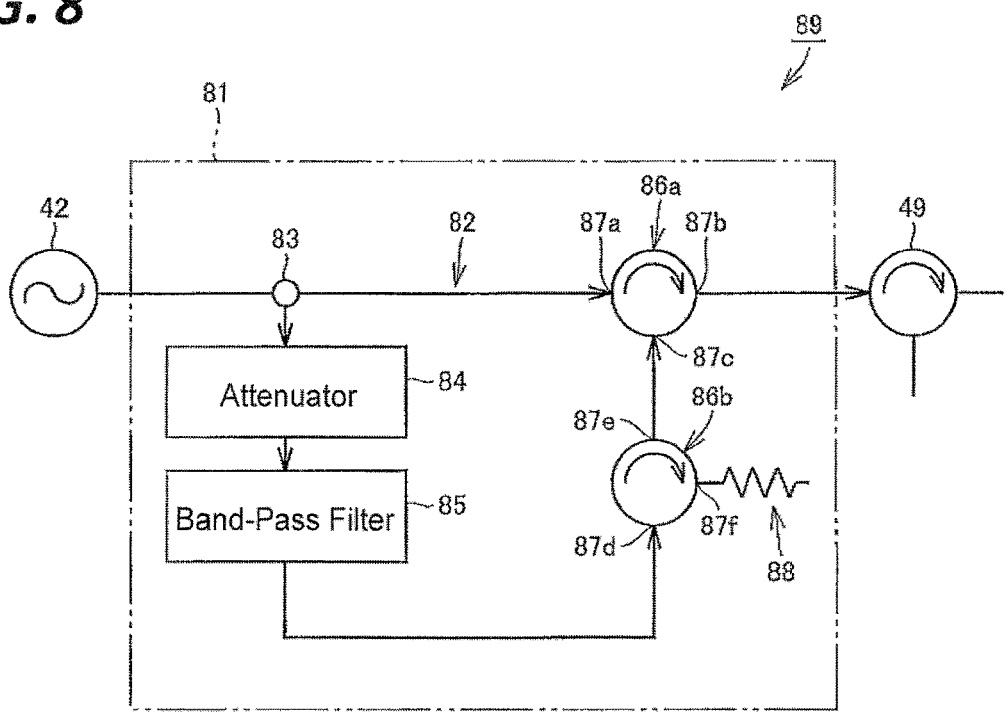
FIG. 8 is a block diagram illustrating a branch circuit included in a microwave generator provided in a plasma processing device according to yet another exemplary embodiment of the present invention.

FIG. 8 is a block diagram illustrating a branch circuit as an injection unit included in a microwave generator included in a plasma generation mechanism provided in a plasma processing device 89 according to yet another exemplary embodiment of the present invention. FIG. 8 corresponds to the diagrams illustrated in FIGS. 6 and 7. Further, since other configurations except for the branch circuit as the injection unit included in the microwave generator provided in the plasma processing device 89 according to yet another exemplary embodiment of the present invention are the same as the plasma processing device 11, the descriptions thereof will be omitted.

Referring to FIG. 8, a branch circuit 81 as the injection unit included in the microwave generator included in the plasma generation mechanism provided in the plasma processing device 89 according to yet another exemplary embodiment of the present invention includes a branch portion 83 branched from a waveguide 82 extending from the magnetron 42 to the isolator 49, an attenuator 84 configured to attenuate a signal having a fundamental frequency branched from the branch portion 83, a band-pass filter 85 configured to perform filtering of a frequency signal attenuated by the attenuator 84 by allowing only a predetermined frequency band to pass therethrough, a second circulator 86b configured to transmit the frequency signal to a first circulator 86a provided in the waveguide 82 with respect to the frequency filtered by the band-pass filter 85, and a first circulator 86a provided in the waveguide 82 and configured to inject the signal transmitted from the second circulator 86b into the magnetron 42 side.

In the first circulator 86a, a first terminal 87a is connected to the magnetron 42 side, a second terminal 87b is connected to the isolator 49 side, and a third terminal 87c is connected to a second terminal 87e of the second circulator 86b. In the second circulator 86b, a first terminal 87d is connected to the band-pass filter 85, the second terminal 87e is connected to the third terminal 87c of the first circulator 86a, and a third terminal 87f is connected to a dummy load 88. The second circulator 86b functions as an isolator that transmits the frequency signal unidirectionally from the band-pass filter 85 to the first circulator 86a.

That is, a substantial difference between the configuration of the branch circuit illustrated in FIG. 7 and the configuration of the branch circuit illustrated in FIG. 8 is to omit the semiconductor amplifier and one band-pass filter. With such a configuration, the branch circuit 81 as the injection unit included in the microwave generator included in the plasma generation mechanism provided in the plasma processing device 89 according to still another exemplary embodiment of the present invention may be cheaply configured. Of course, in this case, it is also possible to reduce different frequency components in the high-frequency waves oscillated by the magnetron 42. As such, an effect caused when different frequency components are included in the high-frequency waves oscillated by the magnetron 42 may be reduced. Accordingly, the plasma processing device 89 may stably generate plasma over a long period and realize a long lifespan.

Figure 9:
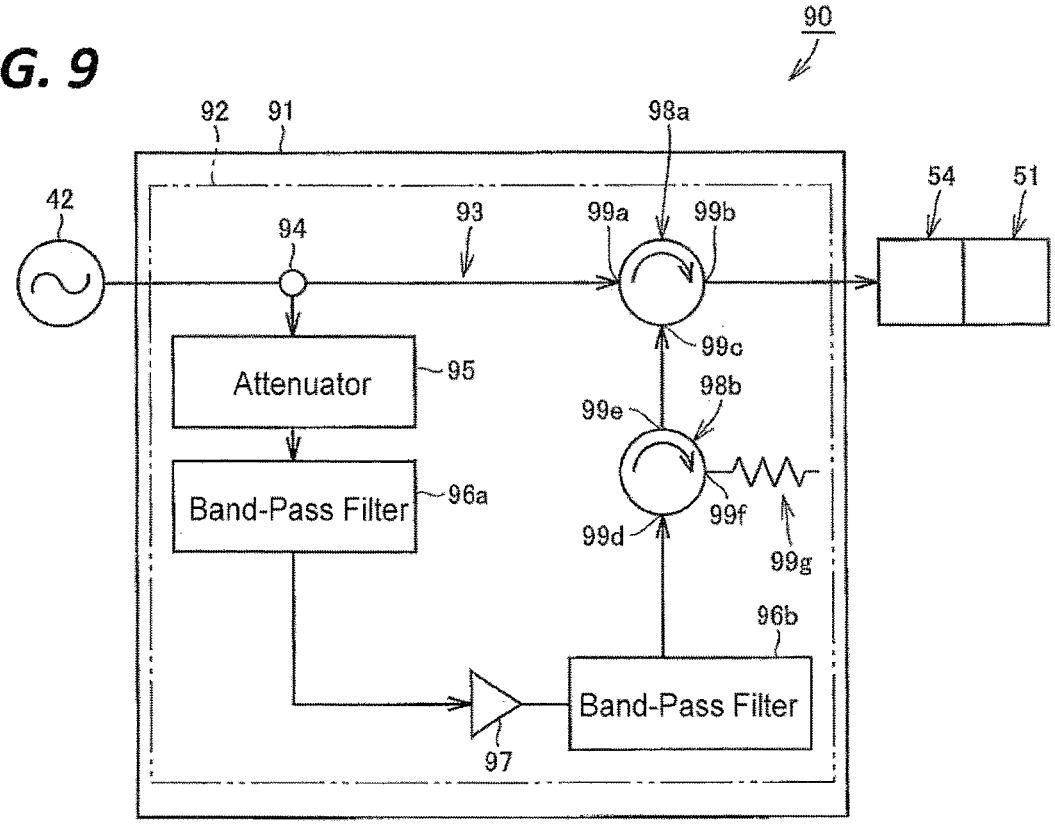
FIG. 9 is a block diagram illustrating a branch circuit included in a microwave generator provided in a plasma processing device according to still another exemplary embodiment of the present invention.

Further, the branch circuit may have a configuration as illustrated in FIG. 9. FIG. 9 is a block diagram illustrating a branch circuit as an injection unit included in a microwave generator included in a plasma generation mechanism provided in a plasma processing device 90 according to still yet another exemplary embodiment of the present invention, in which an isolator and a branch circuit are integrated with each other and connected to a 4E tuner as a matcher. FIG. 9 corresponds to the diagrams illustrated in FIGS. 6 to 8. Further, since other configurations except for the branch circuit and the isolator as the injection unit included in the microwave generator provided in the plasma processing device 90 according to still yet another exemplary embodiment of the present invention are the same as the plasma processing device 11, the descriptions thereof will be omitted.

Referring to FIG. 9, a branch circuit 92 as the injection unit included in the microwave generator included in the plasma generation mechanism provided in the plasma processing device 90 according to yet another exemplary embodiment of the present invention is integrated with an isolator 91 which transmits unidirectionally a frequency signal from the magnetron 42 to a 4E tuner 51.

The branch circuit 92 includes a branch portion 94 branched from a waveguide 93 extending from the magnetron 42 to the 4E tuner 51, an attenuator 95 configured to attenuate a signal having a fundamental frequency branched from the branch portion 94, a first band-pass filter 96a configured to perform filtering of a frequency signal attenuated by the attenuator 95 by allowing only a predetermined frequency band to pass therethrough, a semiconductor amplifier 97 configured to amplify the frequency with respect to the frequency filtered by the first band-pass filter 96a, a second band-pass filter 96b configured to perform re-filtering of the frequency amplified by the semiconductor amplifier 97 by allowing only a predetermined frequency band to pass therethrough, a second circulator 98b configured to transmit the frequency signal to a first circulator 98a provided in the waveguide 93 with respect to the frequency filtered by the second band-pass filter 96b, and a first circulator 98a provided in the waveguide 93 and configured to inject the signal transmitted from the second circulator 98b into the magnetron 42 side.

In the first circulator 98a, a first terminal 99a is connected to the magnetron 42 side, a second terminal 99b is connected to the 4E tuner 51 side, and a third terminal 99c is connected to a second terminal 99e of the second circulator 98b. In the second circulator 98b, a first terminal 99d is connected to the second band-pass filter 96b, a second terminal 99e is connected to the third terminal 99c of the first circulator 98a, and a third terminal 99f is connected to a dummy load 99g. The second circulator 98b functions as an isolator that transmits the frequency signal unidirectionally from the second band-pass filter 96b to the first circulator 98a.

Further, for example, in FIG. 9, when different frequency components are sufficiently small in an output of the semiconductor amplifier 97, the band-pass filter 96b may be removed and the output of the semiconductor amplifier 97 may be directly connected to the terminal 99d of the circulator 98b.

That is, the configuration of the branch circuit 61 illustrated in FIG. 7 and the configuration of the branch circuit 92 illustrated in FIG. 9 are the same as each other, and a difference therebetween is whether the isolator and the branch circuit are integrated with each other. With such a configuration, the branch circuit 92 as the injection unit included in the microwave generator included in the plasma generation mechanism provided in the plasma processing device 90 according to still yet another exemplary embodiment of the present invention may be simply configured. Of course, in this case, it is also possible to reduce different frequency components in the high-frequency waves oscillated by the magnetron 42. As such, an effect caused when different frequency components are included in the high-frequency waves oscillated by the magnetron 42 may be reduced. Accordingly, the plasma processing device 90 may stably generate plasma over a long period and realize a long lifespan.

Further, like the case where the isolator 49 and the circulator 77a are integrated with each other in FIG. 7 to configure the circulator 98a of FIG. 9, in FIG. 6, the isolator 49 and the circulator 68a may be integrated with each other.

Similarly, in FIG. 8, the isolator 49 and the circulator 86a may be integrated with each other.

Further, in the above-described exemplary embodiment, a directional coupler may be used, instead of the attenuator. In this case, the signal of the fundamental frequency branched from the branch portion is used as it is rather than being attenuated.

Further, in the above-described exemplary embodiment, the amplifier may be configured to amplify the frequency up to 2% or less of a maximum rated power of the high-frequency oscillator. As a result, the amplified frequency may be easily handled.

Figure 10:
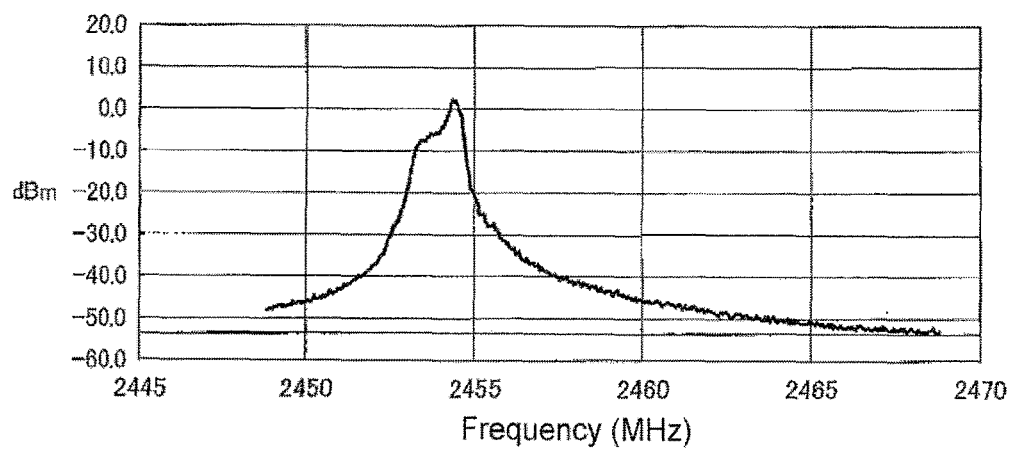
FIG. 10 is a graph illustrating a frequency bandwidth of microwaves generated by the microwave generator which does not include an injection unit, in which as a condition in the microwave generator, the microwave power is set to 2000 W (watt) and the position of a movable short-circuit plate is set to 9 mm.
Figure 11:
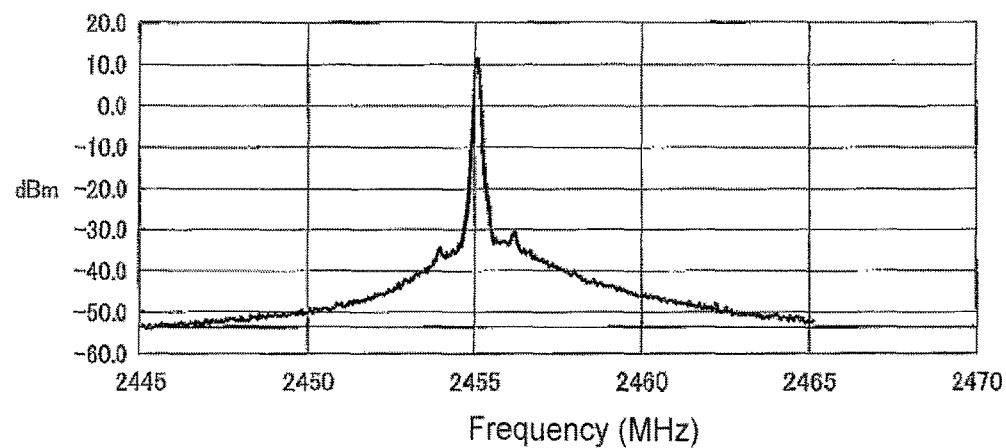
FIG. 11 is a graph illustrating a frequency bandwidth of microwaves generated by a microwave generator which includes an injection unit, in which as a condition in the microwave generator, the microwave power is set to 2000 W (watt) and the position of a movable short-circuit plate is set to 9 mm.

FIG. 10 is a graph illustrating a frequency bandwidth of microwaves generated by a microwave generator which does not include an injection unit. FIG. 11 is a graph illustrating a bandwidth of microwaves generated by a microwave generator which includes the injection unit. In FIGS. 10 and 11, the horizontal axes represent a frequency MHz (mega-hertz), and the vertical axes represent dBm setting 1 mW as 0 dB. Further, in FIGS. 10 and 11, a dimension is increased toward a right side of the lateral axis, and the dimension is increased toward an upper side of the longitudinal axis. Further, since the meanings represented by the lateral axis and the longitudinal axis of graphs illustrated in FIGS. 12 to 19 to be described below are the same as those described above, the description thereof is omitted.

Further, as a condition in the microwave generators in the cases illustrated in FIGS. 10 and 11, the microwave power is set to 2000 W (watt) and a position of a movable short-circuit plate is set to 9 mm.

Referring to FIG. 10, as a waveform of the microwaves, a peak appears at a position which is slightly lower than 2455 MHz, specifically, near 2454 MHz, but the peak has a gentle slope profile in which a portion of a so-called skirt portion is greatly expanded. Specifically, for example, a portion higher than −30.0 dBm is expanded over a wide frequency band, from a point near approximately 2452.5 MHz to a point near 2456 MHz. With respect to this, referring to FIG. 11, as a waveform of microwaves, the peak appears near 2455 MHz, and the peak has a steep slope. Specifically, for example, like the case illustrated in FIG. 10, the portion higher than −30.0 dBm has a narrow frequency band, from a point near approximately 2454.5 MHz to a point near 2455.5 MHz.

Figure 12:
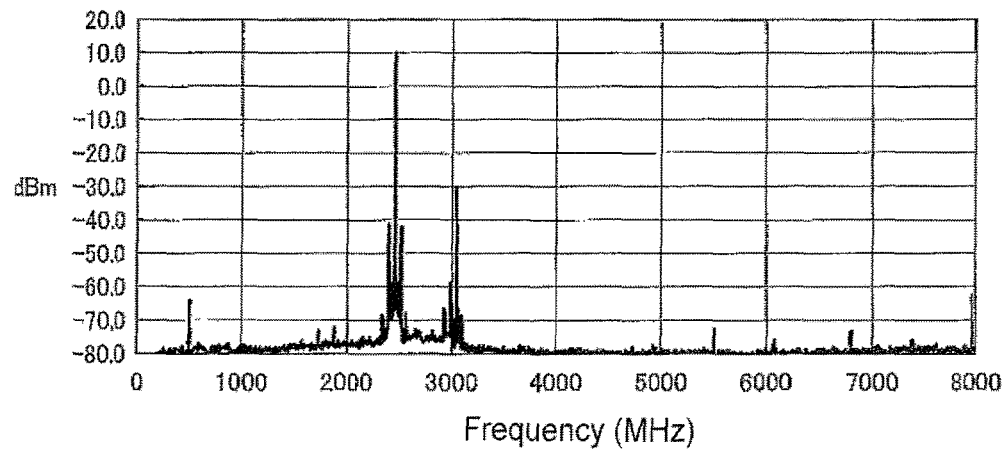
FIG. 12 is a graph illustrating a frequency bandwidth of microwaves generated by the microwave generator which does not includes an injection unit, in which as a condition in the microwave generator, the microwave power is set to 2000 W (watt) and the position of a movable short-circuit plate is set to 9 mm, and the horizontal axis illustrated in FIG. 10 is widely indicated.
Figure 13:
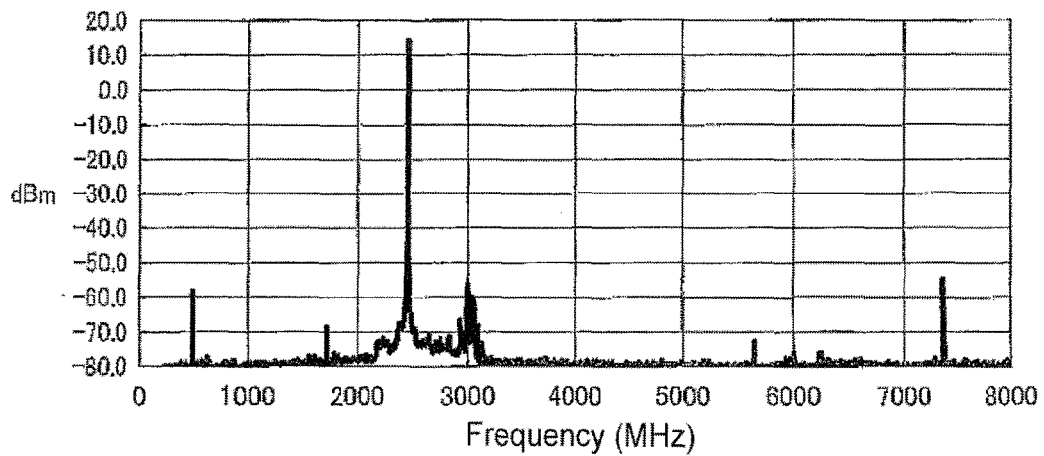
FIG. 13 is a graph illustrating a frequency bandwidth of microwaves generated by a microwave generator which includes an injection unit, in which as a condition in the microwave generator, the microwave power is set to 2000 W (watt) and the position of a movable short-circuit plate is set to 9 mm, and the horizontal axis illustrated in FIG. 11 is widely indicated.

FIGS. 12 and 13 are graphs illustrating the cases illustrated in FIGS. 10 and 11 by expanding the horizontal axes, that is, widths of frequency bands widely, respectively. Referring to FIG. 12, it is found that a very high different frequency component of about −30.0 dBm exists near 3000 MHz. Next, referring to FIG. 13, since the different frequency component existing near 3000 MHz becomes lower than about −55.0 dBm, at least −50.0 dBm, it is found that different frequency components are greatly reduced.

Figure 14:
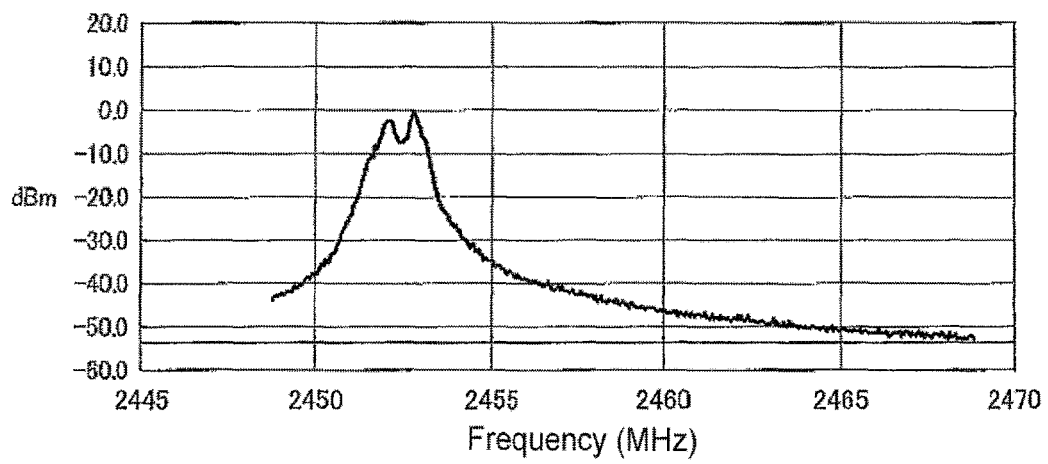
FIG. 14 is a graph illustrating a frequency bandwidth of microwaves generated by a microwave generator which does not include an injection unit, in which as a condition in the microwave generator, the microwave power is set to 2000 W (watt) and the position of a movable short-circuit plate is set to 13 mm.
Figure 15:
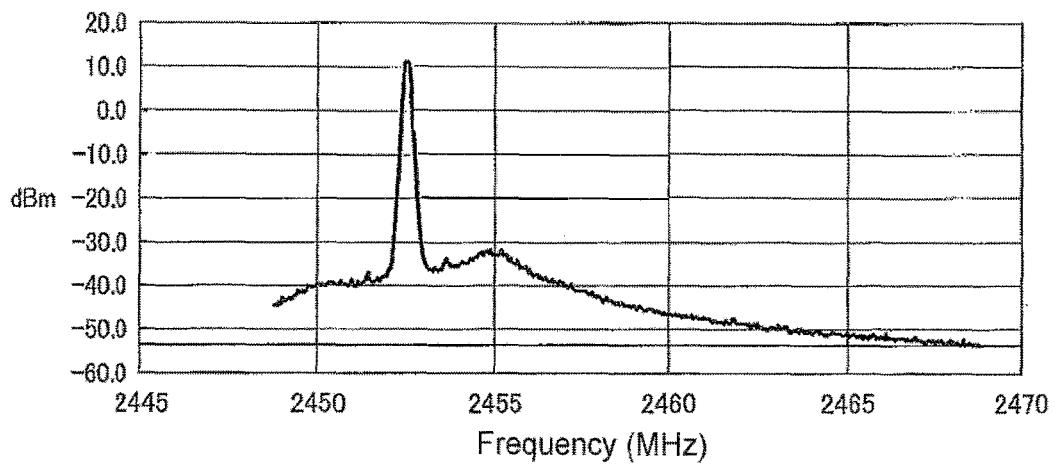
FIG. 15 is a graph illustrating a frequency bandwidth of microwaves generated by a microwave generator which includes an injection unit, in which as a condition in the microwave generator, the microwave power is set to 2000 W (watt) and the position of a movable short-circuit plate is set to 13 mm.

FIG. 14 is a graph illustrating a frequency bandwidth of microwaves generated by a microwave generator which does not include an injection unit. FIG. 15 is a graph illustrating a bandwidth of microwaves generated by a microwave generator which includes the injection unit. In FIGS. 14 and 15, as a condition in the microwave generators, the microwave power is set to 2000 W (watt) and a position of a movable short-circuit plate is set to 13 mm.

Referring to FIG. 14, as a waveform of microwaves, two peaks appear. Specifically, a first peak appears near 2452 MHz, and a second peak appears near 2453 MHz. Further, the waveform has a gentle slope profile and a portion of a so-called skirt portion is greatly expanded. Specifically, for example, a portion higher than −30.0 dBm is over a wide frequency band, substantially from a point near 2451 MHz to a point near 2454 MHz. With respect to this, referring to FIG. 15, as a waveform of microwaves, the peak is shown near 2452.5 MHz and has a steep slope. Specifically, for example, like the case illustrated in FIG. 14, the portion higher than −30.0 dBm is a narrow frequency band, substantially from a point near 2452 MHz to a point near 2453 MHz.

Figure 16:
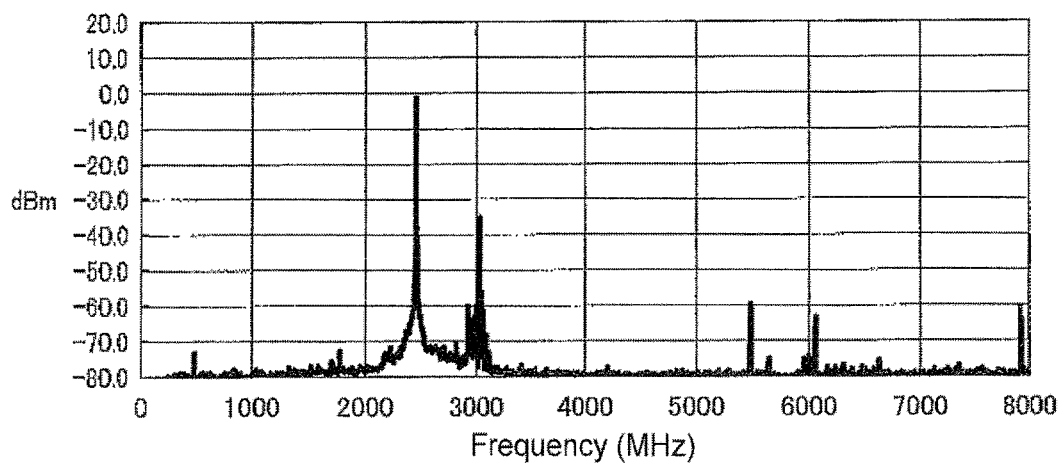
FIG. 16 is a graph illustrating a frequency bandwidth of microwaves generated by a microwave generator which does not includes an injection unit, in which as a condition in the microwave generator, the microwave power is set to 2000 W (watt) and the position of a movable short-circuit plate is set to 13 mm, and the horizontal axis illustrated in FIG. 13 is widely indicated.
Figure 17:
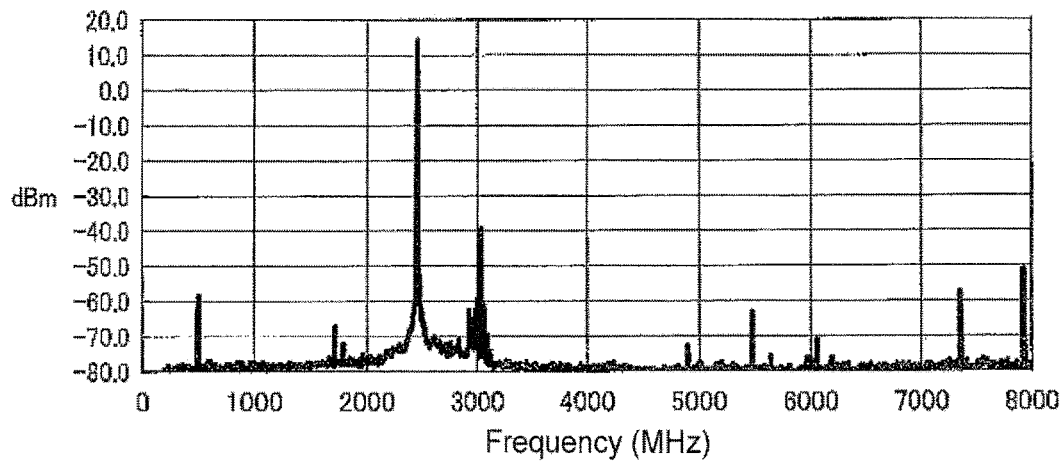
FIG. 17 is a graph illustrating a frequency bandwidth of microwaves generated by a microwave generator which includes an injection unit, in which as a condition in the microwave generator, the microwave power is set to 2000 W (watt) and the position of a movable short-circuit plate is set to 13 mm, and the horizontal axis illustrated in FIG. 14 is widely indicated.

FIGS. 16 and 17 are graphs illustrating the cases illustrated in FIGS. 14 and 15 by expanding the horizontal axes, that is, widths of frequency bands widely, respectively. Referring to FIG. 16, it is found that a high different frequency component of about −35.0 dBm exists near 3000 MHz. Next, referring to FIG. 17, since the different frequency component existing near 3000 MHz is about −40.0 dBm, it is found that different frequency components are greatly reduced.

Figure 18:
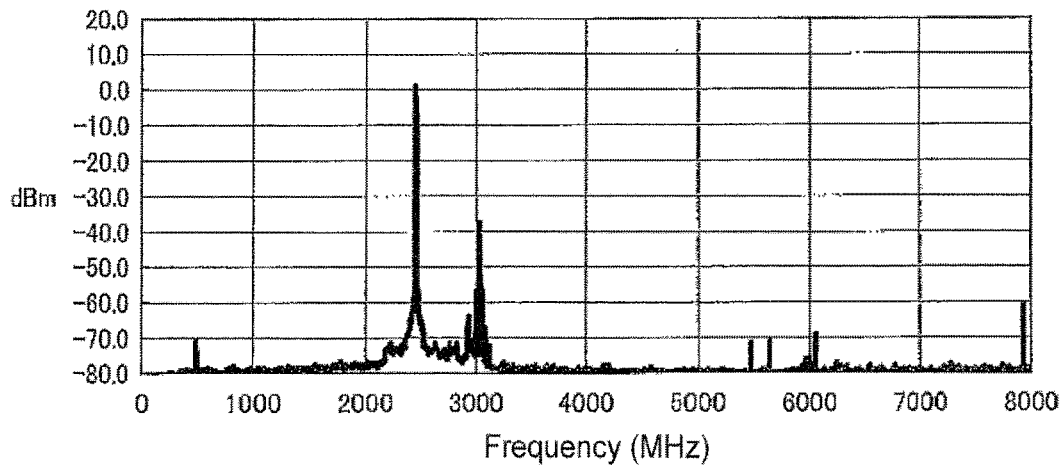
FIG. 18 is a graph illustrating a frequency bandwidth of microwaves generated by a microwave generator which does not include an injection unit, in which as a condition in the microwave generator, the microwave power is set to 2300 W (watt) and the position of a movable short-circuit plate is set to 12 mm.
Figure 19:
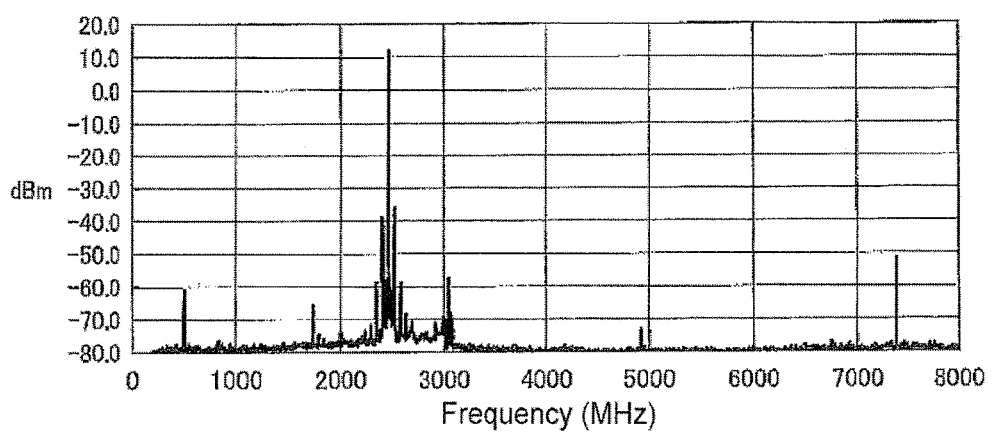
FIG. 19 is a graph illustrating a frequency bandwidth of microwaves generated by a microwave generator which includes an injection unit, in which as a condition in the microwave generator, the microwave power is set to 2300 W (watt) and the position of a movable short-circuit plate is set to 12 mm.

FIG. 18 is a graph illustrating a frequency bandwidth of microwaves generated by a microwave generator which includes an injection unit. FIG. 19 is a graph illustrating a bandwidth of microwaves generated by a microwave generator which includes an injection unit. In FIGS. 18 and 19, as a condition in the microwave generators, microwave power is set to 2300 W (watt) and a position of a movable short-circuit plate is set to 12 mm. Further, the horizontal axes are the same as the horizontal axes in FIGS. 12, 13, 16, and 17.

Referring to FIG. 18, it may be determined that a large different frequency component of about −38.0 dBm exists near 3000 MHz. Next, referring to FIG. 19, since the different frequency component existing near 3000 MHz is about −58.0 dBm, it is found that different frequency components are greatly reduced.

From the foregoing, according to the configurations, plasma may be generated over a long period and a long lifespan may be realized.

Further, a semiconductor amplifier is used as an amplifier in the above-described exemplary embodiments, but other amplifiers may also be used without being limited thereto.

Further, a band-pass filter is used as a member that performs filtering in the above-described exemplary embodiments. In this case, a combination of a low pass filter (LPF) and a high pass filter (HPF) may be used, and if necessary, only one of the LPF and the HPF may be used.

Further, a branch circuit is provided as an injection unit in the above-described exemplary embodiments, but another method may be used without being limited thereto. For example, the injection unit may be configured to inject a signal having a frequency which is the same as the fundamental frequency oscillated by a high-frequency oscillator and having reduced different frequency components into the high-frequency oscillator in an initial step of manufacturing the plasma processing device without being provided with a branch circuit.

For example, in FIG. 6, the frequency voltage conversion unit 64 is provided a frequency detecting unit, but the frequency voltage conversion unit 64 may determine the frequency in the initial manufacturing step, and the semiconductor oscillator 65 may set and output the determined frequency. In this case, the attenuator 63 and the frequency voltage conversion unit 64 are required for the measurement in the initial manufacturing step, but may be removed. As a result, a system may be cheaply constructed. Further, although the frequency voltage conversion unit 64 is used as the frequency determining unit, any frequency detecting unit may be used, and a commercially available frequency counter or spectrum analyzer may be used.

Further, the frequency may be determined using the frequency detecting unit regularly even when the processing starts to be performed without being limited to the initial manufacturing step so that the semiconductor oscillator 65 may set and output the determined frequency.

Further, although a plasma processing is performed by microwaves using a radial line slot in the above-described exemplary embodiments, a plasma processing device that generates plasma by microwaves with a comb-shaped antenna unit or a plasma processing device that generates plasma by radiating microwaves from a slot may be used, without being limited thereto.

Hereinabove, the exemplary embodiments of the present invention have been described with reference to the accompanying drawings, but the present invention is not limited to the illustrated exemplary embodiments. Various changes and modifications of the illustrated exemplary embodiments can be made within the same scope as the present invention or within a scope equivalent to the present invention.

DESCRIPTION REFERENCE NUMERALS

11, 80, 89, 90: Plasma processing apparatus
12: Processing container
13, 26, 27: Gas supply unit
14: Holding table
15: Control unit
16: Dielectric window
17: Slot antenna plate
18: Dielectric member
19: Plasma generation mechanism
20: Slot hole
21: Bottom portion
22: Side wall
23: Exhaust hole
24: Cover portion
25: O-ring
28: Bottom surface
29: Gas supply system
30*a*, 30*b*: Gas supply hole
31: Tubular support
32: Cooling jacket
33: Temperature adjustment mechanism
34: Mode converter
35: Waveguide
36: Coaxial waveguide
37: Concave portion
38: High-frequency power supply
39: Matching unit
40: Circulation path
41: Microwave generator
42: Magnetron
43: High-voltage power supply
44: Filament power supply
45: Circuit
46*a*: Cathode electrode
46*b*: Anode electrode
48: Microwaves
49, 91: Isolator
50: Load
51: 4E Tuner
52*a*, 52*b*, 52*c*, 52*d*: Movable short-circuit unit
53*a*, 53*b*, 53*c*: Probe
53*d*: Arithmetic operation circuit
54: Directional coupler
55*a*, 55*b*: Power signal
56: Voltage control circuit 57a, 57b: Control signal
58a, 58b, 58c, 69a, 69b, 69c, 69d, 69e, 69f, 78a, 78b, 78c, 78d, 78e, 78f, 87a, 87b, 87c, 87d, 87e, 87f, 99a, 99b, 99c, 99d, 99e, 99f: Terminal
59, 70, 79, 88, 99g: Dummy load
60, 72, 82, 93: Waveguide
61, 71, 81, 92: Branch circuit
62, 73, 83, 94: Branch portion
63, 74, 84, 95: Attenuator
64: Frequency voltage conversion unit
65: Semiconductor oscillator
66, 76, 97: Semiconductor amplifier
67, 75a, 75b, 85, 96a, 96b: Band-pass filter
68a, 68b, 77a, 77b, 86a, 86b, 98a, 98b: Circulator

The invention claimed is:

1. A plasma processing device which processes an object to be processed using plasma, the plasma processing device comprising:
a processing container configured to perform a processing on the object by the plasma therein; and
a plasma generator including a high-frequency generator disposed outside the processing container to generate high-frequency waves, and the plasma generator being configured to generate the plasma in the processing container using the high-frequency waves generated by the high-frequency generator,
wherein the high-frequency generator includes a first high-frequency oscillator configured to generate the high-frequency waves and a branch circuit configured to inject a signal into the first high-frequency oscillator, wherein the first high frequency oscillator is a magnetron,
the branch circuit comprises a second high-frequency oscillator which is configured to detect a fundamental frequency of the high-frequency waves generated by the first high-frequency oscillator and to generate, based on the fundamental frequency of the high-frequency waves, the signal having a frequency which is the same as the fundamental frequency generated by the first high-frequency oscillator and having reduced different frequency components, and wherein the branch circuit injects the signal generated by the second high-frequency oscillator into the first high-frequency oscillator through a first band-pass filter,
wherein the fundamental frequency of the high-frequency waves is not changed after the branch circuit injects the signal generated by the second high-frequency oscillator into the first high-frequency oscillator.

2. The plasma processing device of claim 1, wherein the first high-frequency generator includes an isolator configured to transmit a frequency signal unidirectionally from the first high-frequency oscillator to a matcher positioned at a load side, and a waveguide provided between the first high-frequency oscillator and the isolator and configured to propagate the high-frequency waves to the isolator side,
the branch circuit includes a branch portion provided in the waveguide, and
the branch circuit includes a signal generator configured to form the signal having the frequency which is the same as the fundamental frequency generated by the first high-frequency oscillator and the reduced different frequency components, using high-frequency waves branched from the branch portion and input to the branch circuit.

3. The plasma processing device of claim 2, wherein the branch circuit includes a first circulator provided between the branch portion and the isolator on the waveguide, and the first circulator includes three terminals, and
in the first circulator, a first terminal is connected to the first high-frequency oscillator side, a second terminal is connected to the isolator side, and a third terminal is connected at a side where the signal generator is provided.

4. The plasma processing device of claim 3, wherein the branch circuit includes a second circulator, and
in the second circulator, a first terminal is connected to the first band-pass filter, a second terminal is connected to the third terminal of the first circulator, and a third terminal is connected to a dummy load.

5. The plasma processing device of claim 2, wherein the signal generator includes an attenuator configured to branch a part of a frequency signal of the high-frequency waves from the branch portion and attenuate the frequency signal of the high-frequency waves so that an attenuated frequency signal is input into the branch circuit, or a directional coupler configured to branch a part of the frequency signal of the high-frequency waves from the branch portion and input the branched frequency signal into the branch circuit.

6. The plasma processing device of claim 2, wherein the first band-pass filter is configured to perform filtering of a frequency of a predetermined band from the fundamental frequency generated by the first high-frequency oscillator.

7. The plasma processing device of claim 6, wherein the signal generator includes an amplifier configured to amplify a frequency signal branched and input into the branch circuit and subjected to the filtering of the frequency of the predetermined band by the first band-pass filter, and a second band-pass filter configured to perform filtering of the frequency of the predetermined band from the frequency signal amplified by the amplifier.

8. The plasma processing device of claim 2, wherein the signal generator includes a frequency voltage converter configured to convert the frequency input into the branch circuit from the attenuator or the directional coupler into a voltage.

9. The plasma processing device of claim 8, wherein the signal generator includes an amplifier configured to amplify the frequency generated by the second high-frequency oscillator, and the first band-pass filter is configured to filter the frequency of the predetermined band from the frequency signal amplified by the amplifier.

10. The plasma processing device of claim 8, wherein the second high-frequency oscillator includes any one of a semiconductor oscillator, a VCO, and an MEMS oscillator.

11. The plasma processing device of claim 2, wherein the isolator is integrated with the branch circuit.

12. The plasma processing device of claim 1, wherein the branch circuit injects a signal of power which is 2% or less of a maximum rated power of the first high-frequency oscillator.

13. The plasma processing device of claim 1, wherein the plasma generator includes a dielectric window configured to transmit the high-frequency waves generated by the first high-frequency oscillator into the processing container, and a slot antenna plate including a plurality of slot holes and configured to radiate the high-frequency waves to the dielectric window.

14. The plasma processing device of claim 13, wherein the plasma generated by the plasma generator is generated by a radial line slot antenna.

15. The plasma processing device of claim 1, wherein the different frequency components are spurious frequency components.

16. A high-frequency generator comprising:
a first high-frequency oscillator configured to generate high-frequency waves, wherein the first high frequency oscillator is a magnetron; and
a branch circuit configured to inject a signal into the first high-frequency oscillator,
wherein the branch circuit comprises a second high-frequency oscillator which is configured to detect a fundamental frequency of the high-frequency waves generated by the first high-frequency oscillator and to generate, based on the fundamental frequency of the high-frequency waves, the signal having a frequency which is the same as a fundamental frequency generated by the first high-frequency oscillator and having reduced different frequency components, and
wherein the branch circuit injects the signal generated by the second high-frequency oscillator into the first high-frequency oscillator through a first bandpass filter,
wherein the fundamental frequency of the high-frequency waves is not changed after the branch circuit injects the signal generated by the second high-frequency oscillator into the first high-frequency oscillator.

17. The high-frequency generator of claim 16, wherein the different frequency components are spurious frequency components.

* * * * *